(12) United States Patent
Chen et al.

(10) Patent No.: US 9,263,330 B2
(45) Date of Patent: Feb. 16, 2016

(54) SEMICONDUCTOR DEVICE, METHOD FOR FORMING CONTACT AND METHOD FOR ETCHING CONTINUOUS RECESS

(71) Applicant: Taiwan Semiconductor Manufacturing Company Limited, Hsinchu (TW)

(72) Inventors: Yun-Hua Chen, Hsinchu County (TW); Yi-Chun Huang, Taoyuan County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/152,115

(22) Filed: Jan. 10, 2014

(65) Prior Publication Data
US 2015/0200136 A1  Jul. 16, 2015

(51) Int. Cl.
*H01L 21/44* (2006.01)
*H01L 21/768* (2006.01)
*H01L 21/311* (2006.01)
*H01L 23/48* (2006.01)

(52) U.S. Cl.
CPC .... *H01L 21/76897* (2013.01); *H01L 21/31111* (2013.01); *H01L 21/76802* (2013.01); *H01L 23/481* (2013.01)

(58) Field of Classification Search
CPC ........... H01L 21/76831; H01L 21/67063; H01L 21/67069; H01L 21/76205; H01L 21/31116; H01L 21/31138; H01L 21/823835; H01L 21/3141; H01L 21/3105; H01L 21/76224; H01L 21/76877
USPC ......... 438/672, 675, 668, 692, 706, 745, 723, 438/725, 786, 787, 779, 755, 684, 685; 257/382, 383, E21.006, E21.126, 257/E21.127, E21.278, E21.229, E21.293, 257/E21.304, E21.319, E21.577, E21.585
See application file for complete search history.

(56) References Cited

U.S. PATENT DOCUMENTS

| 6,281,064 | B1 * | 8/2001 | Mandelman et al. | 438/233 |
| 6,740,979 | B1 * | 5/2004 | Tamura | 257/776 |
| 7,022,567 | B2 * | 4/2006 | Huh | 438/233 |
| 7,518,171 | B2 * | 4/2009 | Sze et al. | 257/292 |
| 2011/0108930 | A1 | 5/2011 | Cheng et al. | |
| 2012/0112252 | A1 | 5/2012 | Yin et al. | |
| 2012/0139015 | A1 | 6/2012 | Yu et al. | |
| 2012/0139062 | A1 | 6/2012 | Yuan et al. | |
| 2013/0049123 | A1 | 2/2013 | Baars et al. | |

OTHER PUBLICATIONS

German Office Action; Application No. 102014118976.0; dated Oct. 30, 2015.

* cited by examiner

*Primary Examiner* — David Nhu
(74) *Attorney, Agent, or Firm* — Jones Day

(57) ABSTRACT

A method for forming a contact is provided. The method includes: forming a first dielectric layer over a substrate; forming a second dielectric layer over the first dielectric layer; patterning the second dielectric layer to form a first recess; patterning the first dielectric layer by a first etchant through the first recess to form a second recess, wherein the first etchant has a higher etching rate with respect to the first dielectric layer than with respect to the second dielectric layer and further wherein the second recess is aligned with the first recess; and forming a continuous contact plug in the first recess and the second recess.

19 Claims, 10 Drawing Sheets

US 9,263,330 B2

SEMICONDUCTOR DEVICE, METHOD FOR FORMING CONTACT AND METHOD FOR ETCHING CONTINUOUS RECESS

FIELD

This disclosure relates generally to semiconductors, and, more particularly, to a semiconductor device and a method for forming a contact.

BACKGROUND

For nanometer semiconductor processes, shrinkage of the gate pitch and shift of the overlay makes formation of a contact or a recess for the contact increasingly difficult.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
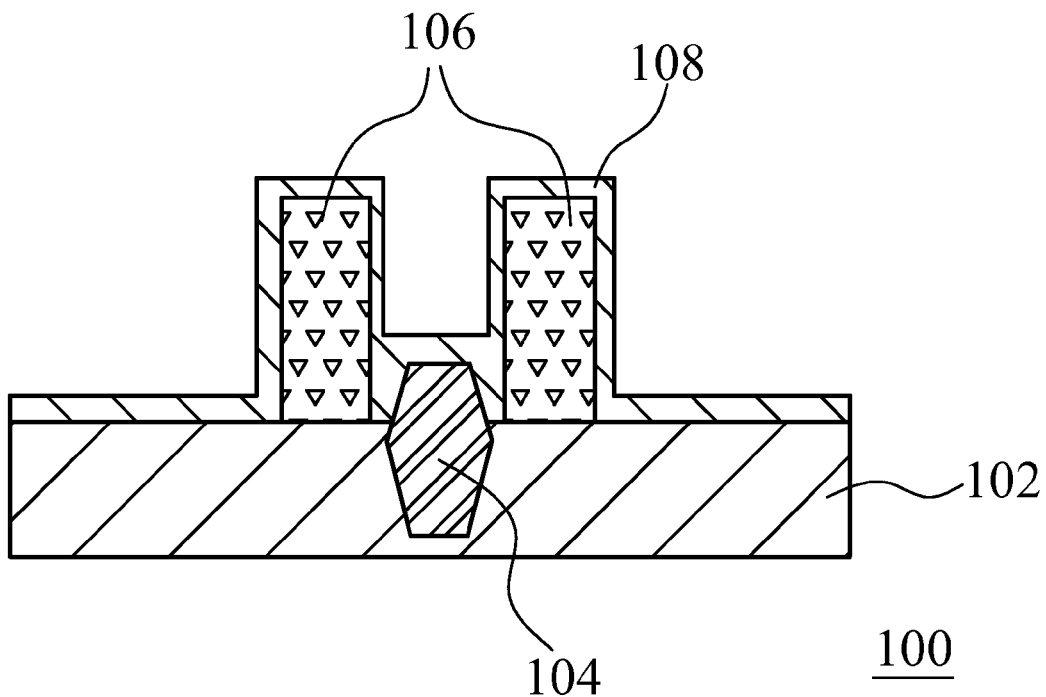
FIG. 1 is a sectional view illustrating an exemplary semiconductor device according to an exemplary embodiment.

FIG. 1 is a sectional view illustrating an exemplary semiconductor device according to an exemplary embodiment. As shown in FIG. 1, a semiconductor device 100 is provided. The semiconductor device 100 includes a substrate and may further include a source 104 and at least one gate 106. In another embodiment, the semiconductor device 100 may include a drain (not shown). The source 104 and the gate 106 are covered by an insulator 108. At least a portion of the source 104 is disposed in the substrate 102. The gate 106 is disposed over the substrate 102.

Figure 2:
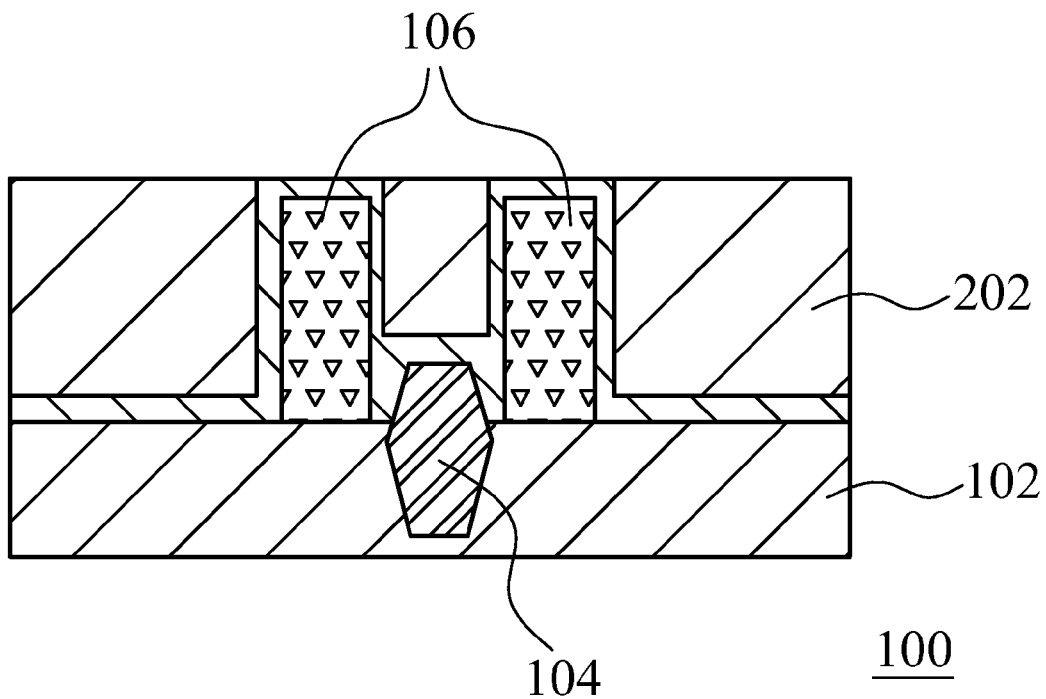
FIG. 2 is a sectional view illustrating the forming of the first dielectric layer in the exemplary semiconductor device according to the exemplary embodiment.

FIG. 2 is a sectional view illustrating the forming of a first dielectric layer in the exemplary semiconductor device according to the exemplary embodiment. As shown in FIG. 2, a first dielectric layer 202 is formed over the substrate 102. To be more specific, the first dielectric layer 202 is formed over the gate 106 and the source 104.

Figure 3:
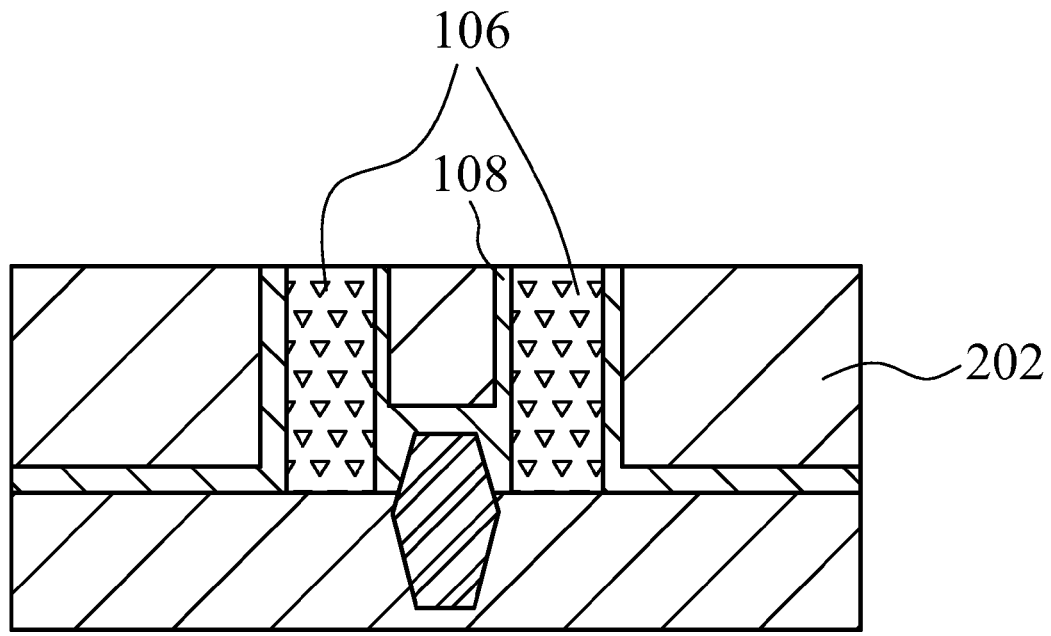
FIG. 3 is a sectional view illustrating the removing of a portion of the insulator in the exemplary semiconductor device according to the exemplary embodiment.

FIG. 3 is a sectional view illustrating the removing of a portion of the insulator in the exemplary semiconductor device according to the exemplary embodiment. As shown in FIG. 3, a portion of first dielectric layer 202 and a portion of the insulator 108 are removed by, for example, chemical mechanical polishing so that the gate 106 is at least partially exposed.

Figure 4:
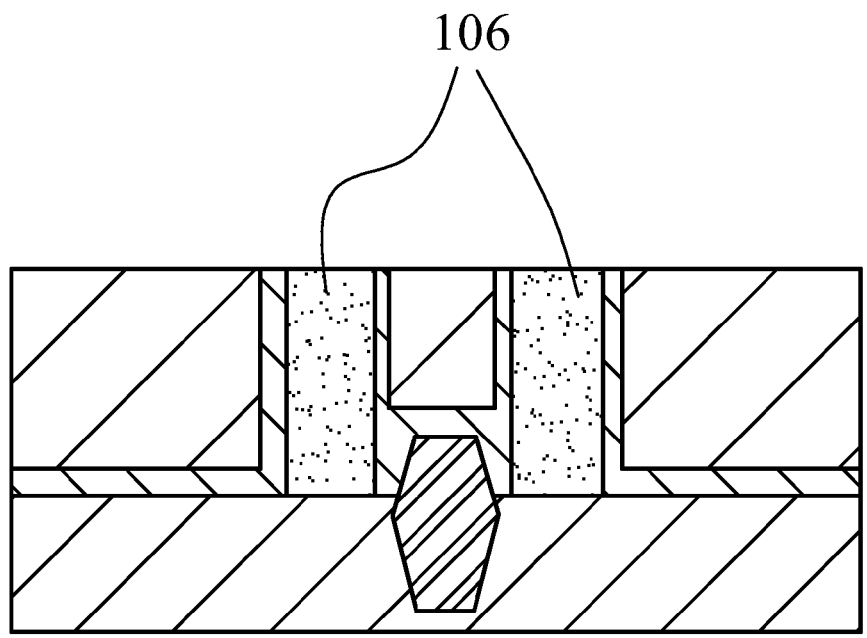
FIG. 4 is a sectional view illustrating the replacement of gate material in the exemplary semiconductor device according to the exemplary embodiment.

FIG. 4 is a sectional view illustrating the replacement of gate material in the exemplary semiconductor device according to the exemplary embodiment. As shown in FIG. 4, the material of the gate 106 may be, for example, polysilicon and further replaced with a metal material.

Figure 5:
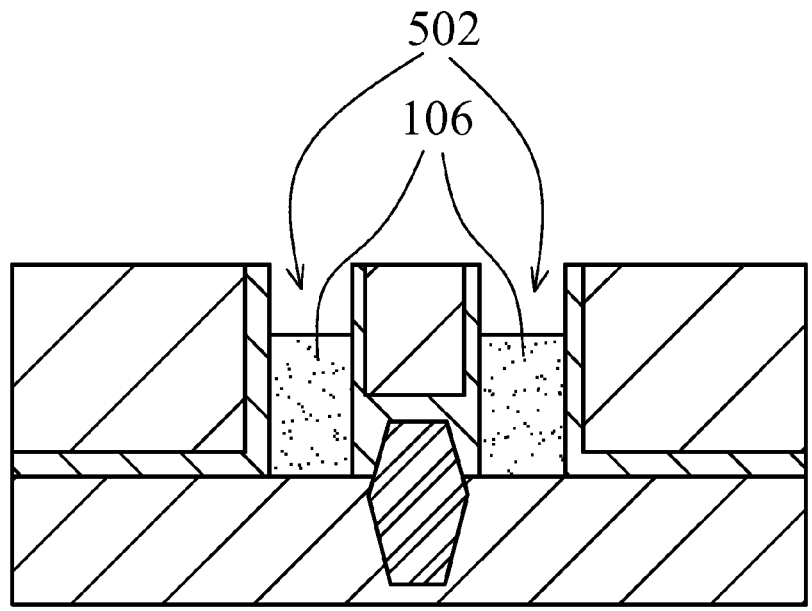
FIG. 5 is a sectional view illustrating the etching of a portion of the gate in the exemplary semiconductor device according to the exemplary embodiment.

FIG. 5 is a sectional view illustrating the etching of a portion of the gate in the exemplary semiconductor device according to the exemplary embodiment. As shown in FIG. 5, a portion of the gate 106 is etched to form a first recess 502 in at least a part of gate 106.

Figure 6:
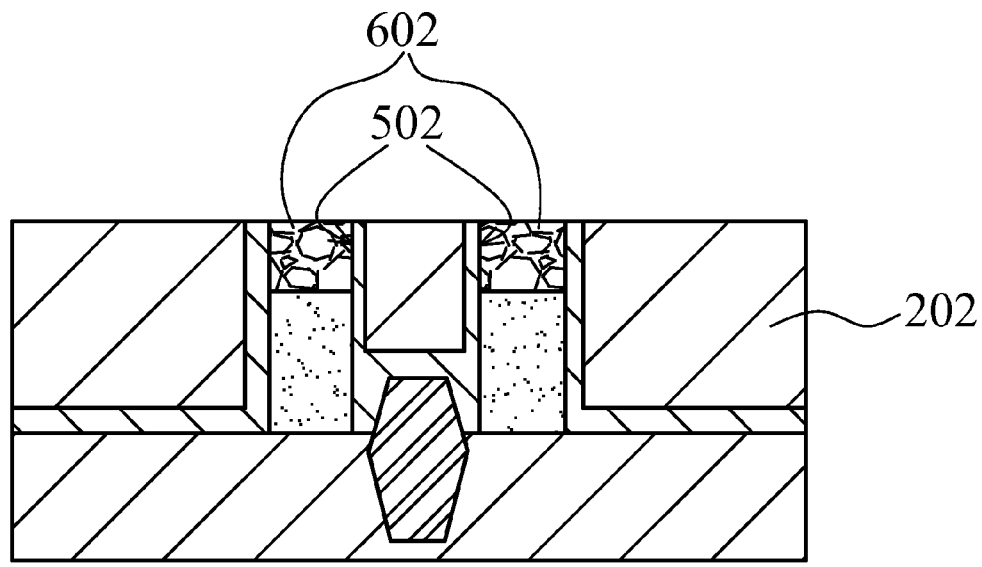
FIG. 6 is a sectional view illustrating the forming of a hard mask in the exemplary semiconductor device according to the exemplary embodiment.

FIG. 6 is a sectional view illustrating the forming of a hard mask in the exemplary semiconductor device according to the exemplary embodiment. As shown in FIG. 6, a hard mask 602 is formed in the first recess 502. The hard mask 602 may be formed of, for example, SiN. Additionally, chemical mechanical polishing may be performed on the hard mask 602 and the first dielectric layer 202.

Figure 7:
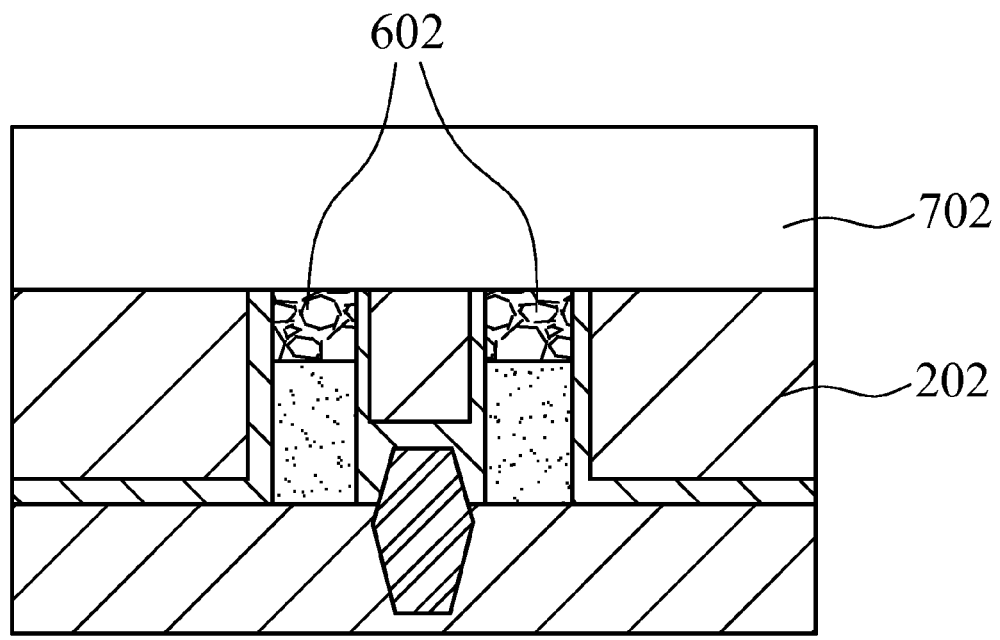
FIG. 7 is a sectional view illustrating the forming of a second dielectric layer in the exemplary semiconductor device according to the exemplary embodiment.

FIG. 7 is a sectional view illustrating the forming of a second dielectric layer in the exemplary semiconductor device according to the exemplary embodiment. As shown in FIG. 7, a second dielectric layer 702 is formed over at least a portion of the first dielectric layer 202 and the hard mask 602.

Figure 8:
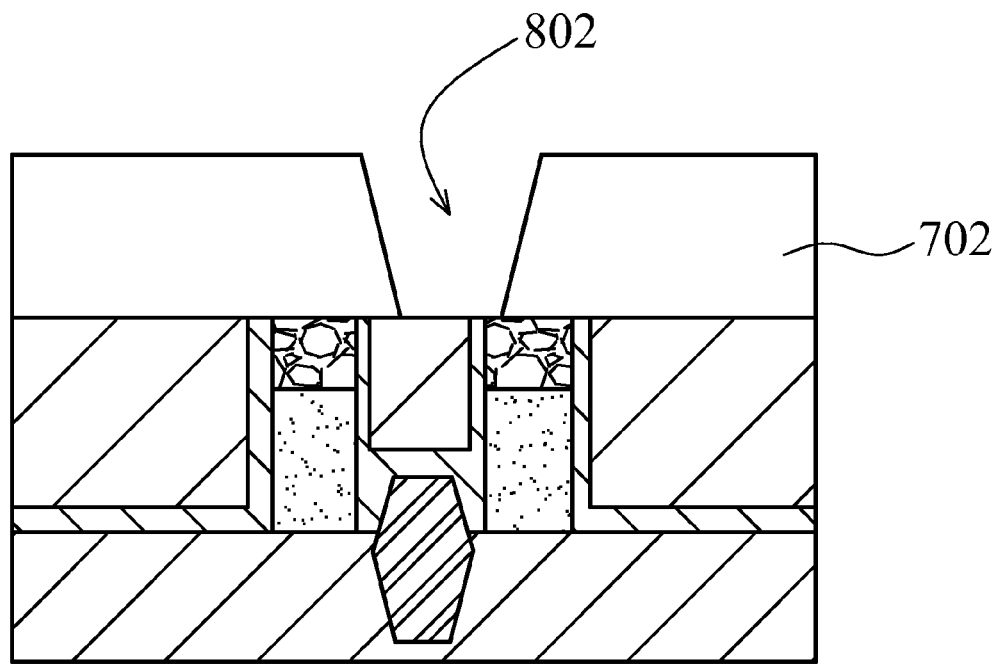
FIG. 8 is a sectional view illustrating the patterning of the second dielectric layer in the exemplary semiconductor device according to the exemplary embodiment.

FIG. 8 is a sectional view illustrating the patterning of the second dielectric layer in the exemplary semiconductor device according to the exemplary embodiment. As shown in FIG. 8, the second dielectric layer 702 is patterned to form a second recess 802 by using a first etchant.

Figure 9:
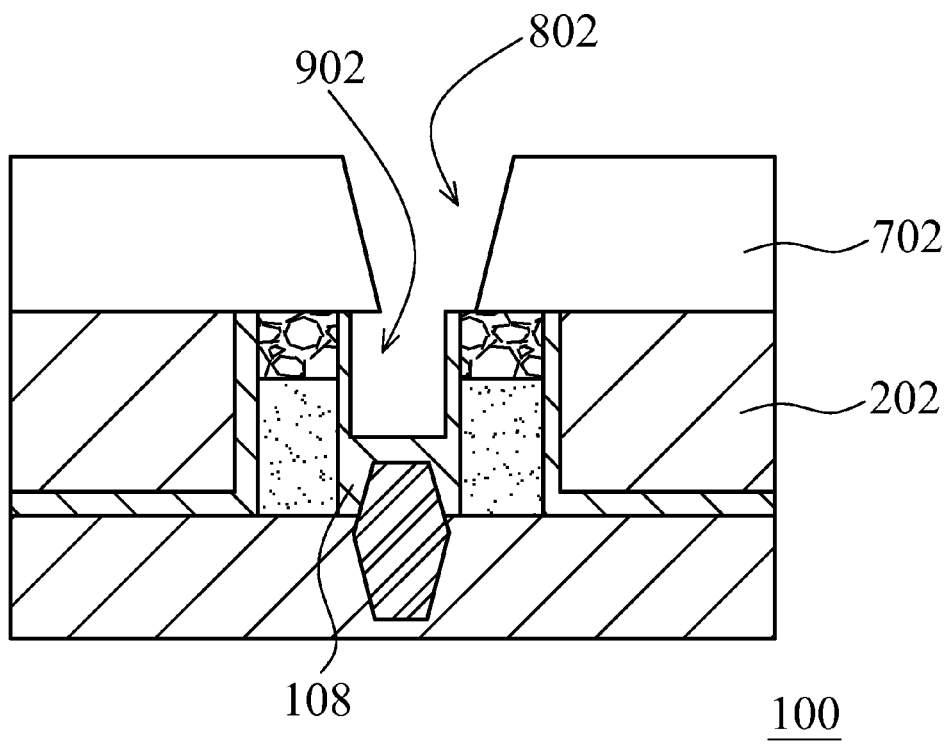
FIG. 9 is a sectional view illustrating the patterning of the first dielectric layer in the exemplary semiconductor device according to the exemplary embodiment.

FIG. 9 is a sectional view illustrating the patterning of the first dielectric layer in the exemplary semiconductor device according to the exemplary embodiment. As shown in FIG. 9, the first dielectric layer 202 is patterned by a second etchant through the second recess 802 so that the third recess 902 is formed. Additionally, the second dielectric layer 702 and the insulator 108 are substantially resistant to the second etchant, compared to the first dielectric layer 202. Therefore, the second recess 802 is aligned with the third recess 902. The second recess 802 and the third recess 902 form a continuous recess.

In the exemplary embodiment, the second etchant has a higher etching rate with respect to the first dielectric layer 202 than with respect to the second dielectric layer 702. For example, the first dielectric layer 202 may be formed of, for example, SiO2 or porous oxide, and the second dielectric layer 702 may be formed of, for example, SiN, SiCN or SiOCN. The etching approach for the first dielectric layer 202 may be a wet etching process using dilute hydrofluoric acid, or a mixture of Tris base, boric acid, and EDTA. The etching approach for the second dielectric layer 702 may be a dry etching process using $C_xF_y$, $O_2$, CO, or Ar.

In another exemplary embodiment, for example, the first dielectric layer 202 may be formed of, for example, organic oxide with more than ten percent carbon, and the second dielectric layer 702 may be formed of, for example, $SiO_2$. The etching approach for the first dielectric layer 202 may be a dry etching process using $N_2H_2$, $N_2O_2$, $CO_2$, CO, or $O_2$. The etching approach for the second dielectric layer 702 may be a dry etching process using $C_xF_y$, O2, CO or Ar.

Figure 10:
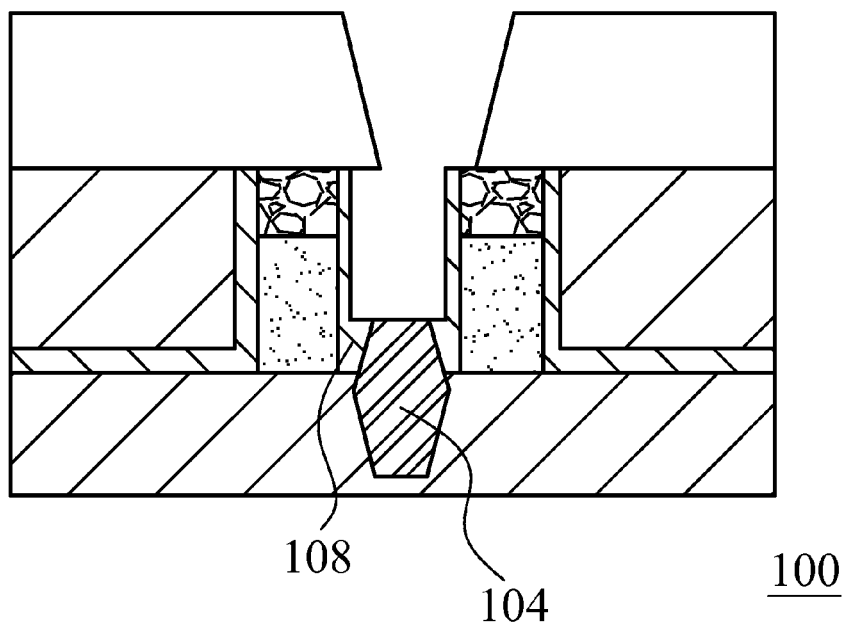
FIG. 10 is a sectional view illustrating the removing of a portion of the insulator in the exemplary semiconductor device according to the exemplary embodiment.

FIG. 10 is a sectional view illustrating the removing of a portion of the insulator in the exemplary semiconductor device according to the exemplary embodiment. As shown in FIG. 10, a portion of the insulator 108 above the source 104 is removed so that the source 104 is exposed.

Figure 11:
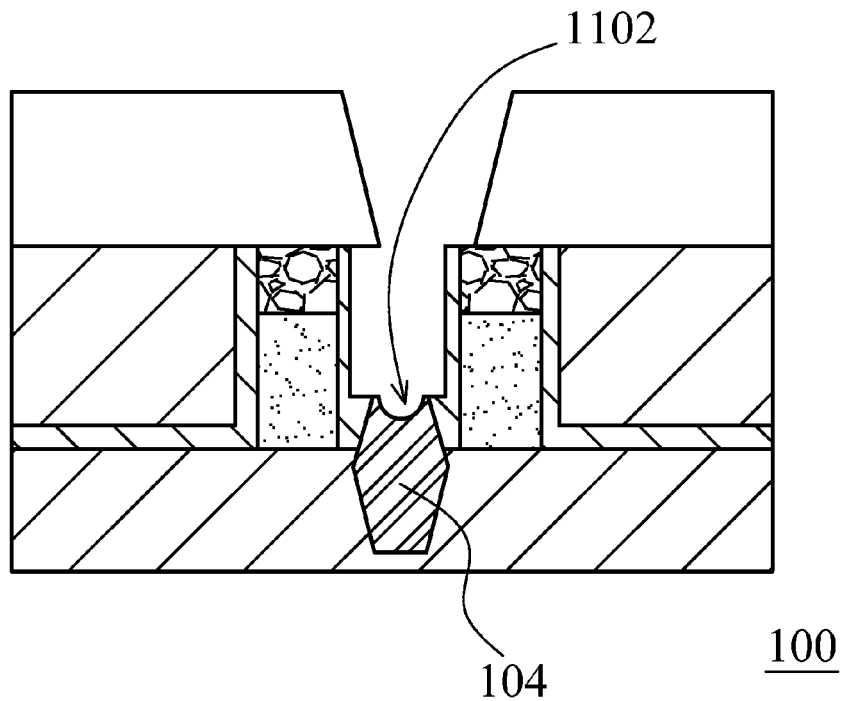
FIG. 11 is a sectional view illustrating the removing of a portion of the source in the exemplary semiconductor device according to the exemplary embodiment.

FIG. 11 is a sectional view illustrating the removing of a portion of the source in the exemplary semiconductor device according to the exemplary embodiment. As shown in FIG. 11, a portion of the source 108 is removed so that a fourth recess 1102 is formed.

Figure 12:
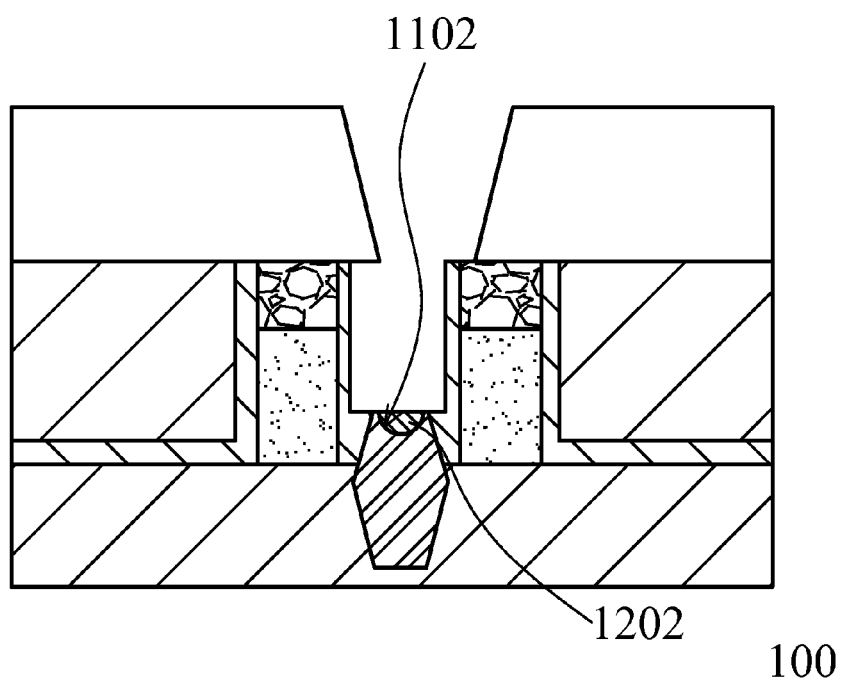
FIG. 12 is a sectional view illustrating the forming of salicide in the exemplary semiconductor device according to the exemplary embodiment.

FIG. 12 is a sectional view illustrating the forming of salicide in the exemplary semiconductor device according to the exemplary embodiment. As shown in FIG. 12, salicide 1202 is formed in the fourth recess 1102.

Figure 13:
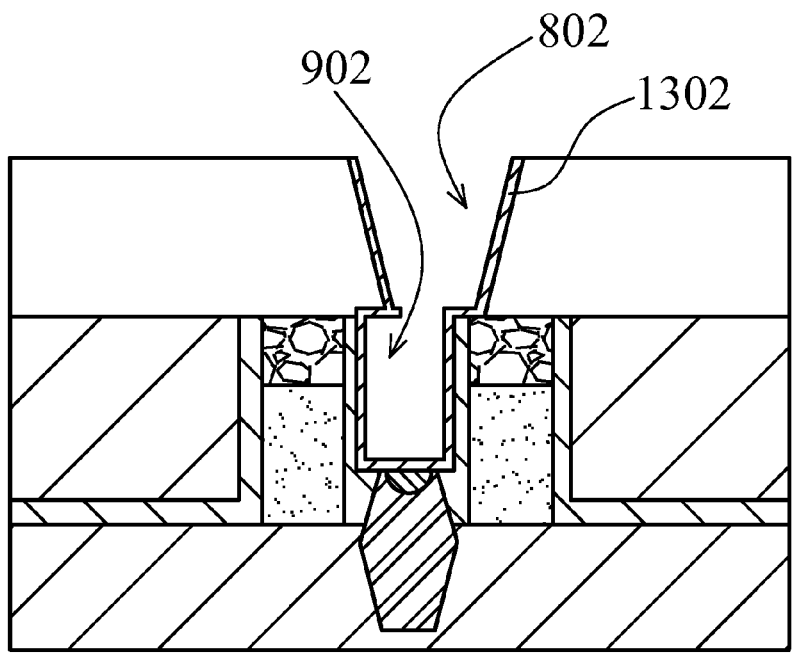
FIG. 13 is a sectional view illustrating the forming of a glue layer in the exemplary semiconductor device according to the exemplary embodiment.

FIG. 13 is a sectional view illustrating the forming of a glue layer in the exemplary semiconductor device according to the exemplary embodiment. As shown in FIG. 13, a glue layer 1302 is formed on a surface of the third recess 902 and the second recess 802. The glue layer 1302 is formed of a compound of, for example, Ti and TiN.

Figure 14:
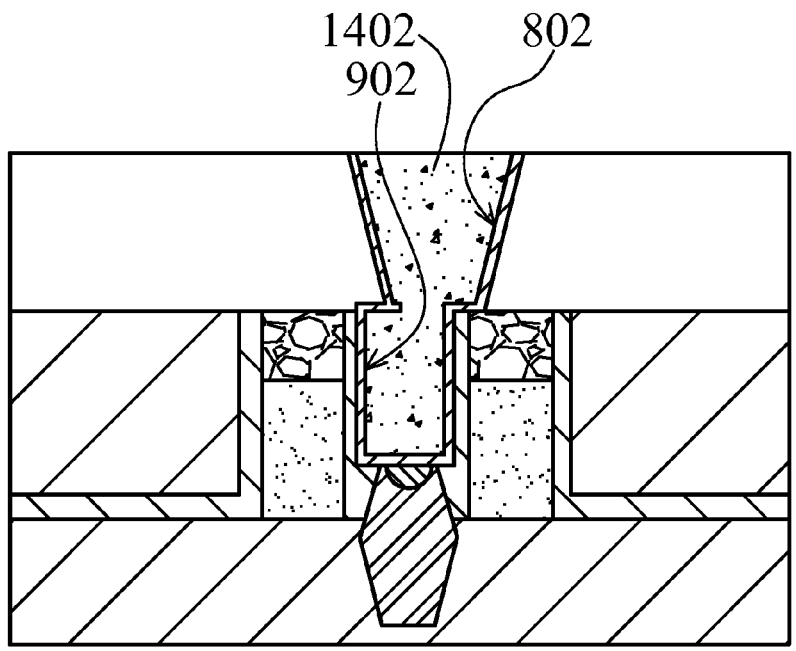
FIG. 14 is a sectional view illustrating the forming of a contact plug in the exemplary semiconductor device according to the exemplary embodiment.

FIG. 14 is a sectional view illustrating the forming of a contact plug in the exemplary semiconductor device according to the exemplary embodiment. As shown in FIG. 14, a continuous contact plug 1402 is formed in the third recess 902 and the second recess 802. The plug contact plug 1402 may be formed of, for example, tungsten.

Figure 15:
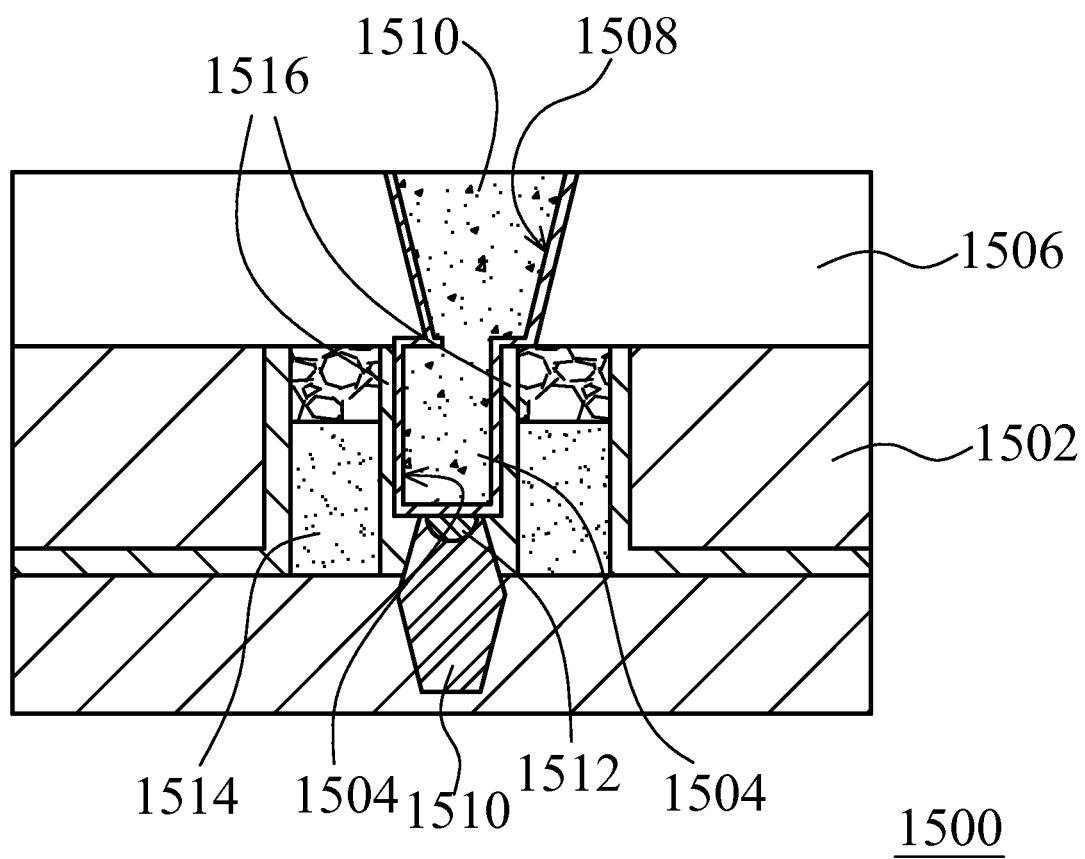
FIG. 15 is a sectional view illustrating an exemplary semiconductor device according to the exemplary embodiment.

FIG. 15 is a sectional view illustrating an exemplary semiconductor device according to the exemplary embodiment. A semiconductor device 1500 is provided. The semiconductor device 1500 includes a first dielectric layer 1502 with a first recess 1504, a second dielectric layer 1506 with a second recess 1508, and a continuous contact plug 1508. The second recess 1508 is at least partially aligned with the first recess 1504. The continuous contact plug 1510 is disposed in the first recess 1504 and the second recess 1508.

In the exemplary embodiment, for example, the first dielectric layer 202 may be formed of, for example, $SiO_2$ or porous oxide, and the second dielectric layer 702 may be formed of, for example, SiN, SiCN or SiOCN.

In another exemplary embodiment, for example, the first dielectric layer 202 may be formed of, for example, organic oxide with more than about ten percent carbon, and the second dielectric layer 702 may be formed of, for example, $SiO_2$.

In the exemplary embodiment, the semiconductor device 1500 may include a source 1510 disposed below at least a portion of the second recess 1508. The source 1510 may be formed of, for example, doped silicon.

In the exemplary embodiment, the semiconductor device 1500 may include a salicide 1512 disposed at a top of the source 1510. The salicide 1512 may be formed of, for example, at least one of cobalt, nickel, and titanium.

In the exemplary embodiment, the semiconductor device 1500 may include a gate 1514 adjacent to the continuous contact plug 1510. The semiconductor device 1500 may include an insulator 1516 between the gate 1514 and the continuous contact plug 1510.

In an exemplary embodiment, the material of the first dielectric layer 1502 is different from the material of the second dielectric layer 1506. Additionally, the first dielectric layer 1502 may have a higher etching rate than the second dielectric layer 1506 when a first etchant is used to form the first recess 1504.

Figure 16:
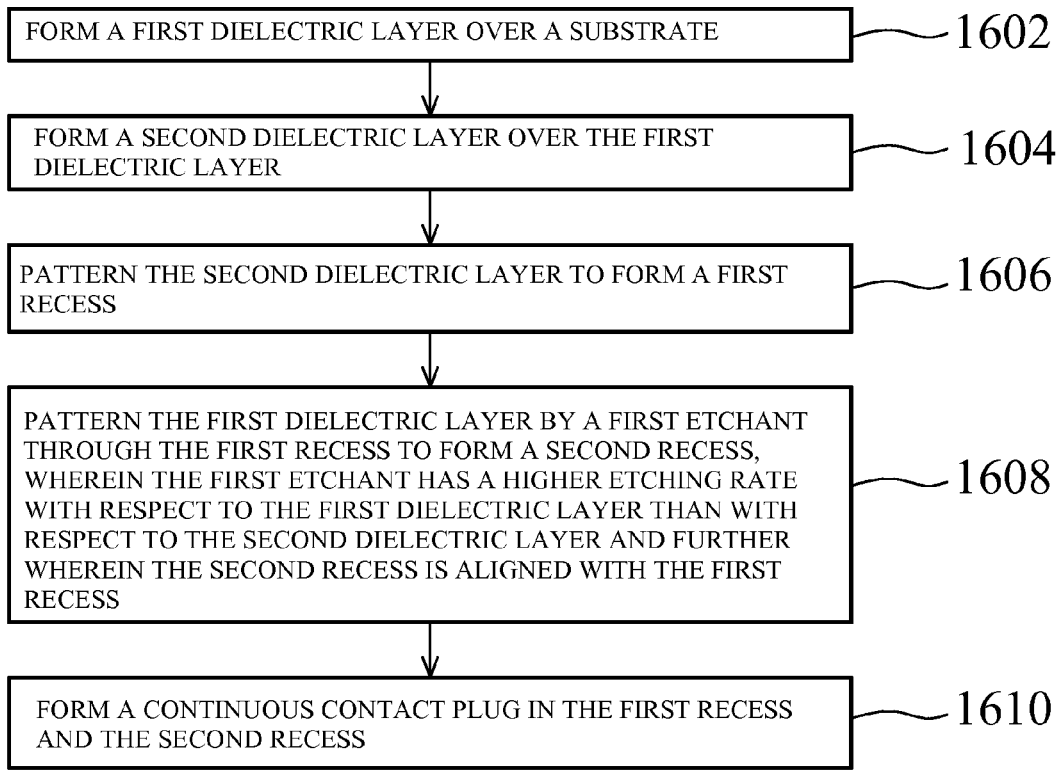
FIG. 16 is a flow chart for forming a contact according to an exemplary embodiment.

FIG. 16 is a flow chart for forming a contact according to an exemplary embodiment. As shown in FIG. 16, a method 1600 is provided. The method 1600 includes the following operations: forming a first dielectric layer over a substrate (1602); forming a second dielectric layer over the first dielectric layer (1604); patterning the second dielectric layer to form a first recess (1606); patterning the first dielectric layer by a first etchant through the first recess to form a second recess, wherein the first etchant has a higher etching rate with respect to the first dielectric layer than with respect to the second dielectric layer and further wherein the second recess is aligned with the first recess (1608); and forming a continuous contact plug in the first recess and the second recess (1610).

In the exemplary embodiment, the method 1600 may further include forming a source covered by an insulator, wherein a portion of the source is disposed in the substrate. In the exemplary embodiment, the method 1600 may further include forming a gate covered by an insulator and disposed over the substrate. In the exemplary embodiment, wherein forming the first dielectric layer over the substrate further comprises: forming the first dielectric layer over the gate and the source. In the exemplary embodiment, the method 1600 may further include removing a portion of the insulator to expose the gate. In the exemplary embodiment, the method 1600 may further include replacing the gate formed of polysilicon with metal material. In the exemplary embodiment, the method 1600 may further include etching a portion of the gate to form a third recess.

In the exemplary embodiment, the method 1600 may further include forming a hard mask in the third recess. In the exemplary embodiment, the method 1600 may further include removing a portion of the insulator above the source. In the exemplary embodiment, the method 1600 may further include removing a portion of the source to form a fourth recess. In the exemplary embodiment, the method 1600 may further include forming salicide in the fourth recess. In the exemplary embodiment, the method 1600 may further include forming a glue layer on a surface of the first recess and the second recess.

Figure 17:
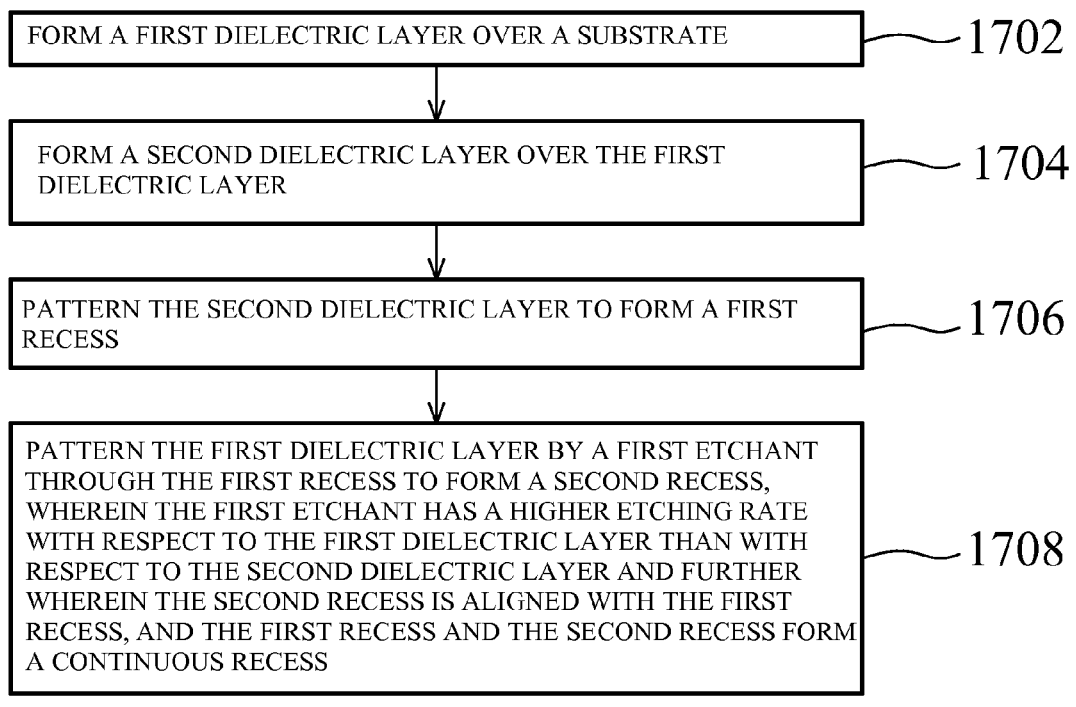
FIG. 17 is a flow chart for etching a continuous recess according to an exemplary embodiment.

FIG. 17 is a flow chart for etching a continuous recess according to an exemplary embodiment. As shown in FIG. 17, a method 1700 is provided. The method 1700 includes the following operations: forming a first dielectric layer over a substrate (1702); forming a second dielectric layer over the first dielectric layer (1704); patterning the second dielectric layer to form a first recess (1706); and patterning the first dielectric layer by a first etchant through the first recess to form a second recess, wherein the first etchant has a higher etching rate with respect to the first dielectric layer than with respect to the second dielectric layer and further wherein the second recess is aligned with the first recess, and the first recess and the second recess form a continuous recess (1708).

According to an exemplary embodiment, a semiconductor device is provided. The semiconductor device includes: a first dielectric layer with a first recess; a second dielectric layer with a second recess, the second recess being at least partially aligned with the first recess; and a continuous contact plug disposed in the first recess and the second recess.

According to an exemplary embodiment, a method for forming a contact is provided. The method includes: forming a first dielectric layer over a substrate; forming a second dielectric layer over the first dielectric layer; patterning the second dielectric layer to form a first recess; patterning the first dielectric layer by a first etchant through the first recess to form a second recess, wherein the first etchant has a higher etching rate with respect to the first dielectric layer than with respect to the second dielectric layer and further wherein the second recess is aligned with the first recess; and forming a continuous contact plug in the first recess and the second recess.

According to an exemplary embodiment, a method for etching a continuous recess is provided. The method includes: forming a first dielectric layer over a substrate; forming a second dielectric layer over the first dielectric layer; patterning the second dielectric layer to form a first recess; and patterning the first dielectric layer by a first etchant to form a second recess, wherein the first etchant has a higher etching rate with respect to the first dielectric layer than with respect to the second dielectric layer and further wherein the second recess is aligned with the first recess, and the first recess and the second recess form a continuous recess.

This written description uses examples in the disclosure to: disclose the best mode and also to enable a person ordinarily skilled in the art to make and use the disclosure. The patentable scope may include other examples that occur to those skilled in the art.

One skilled in the relevant art upon reading this disclosure will recognize that the various embodiments may be practiced without one or more of the specific details, or with other replacement and/or additional methods, materials, or components. Well-known structures, materials, or operations may not be shown or described in detail to avoid obscuring aspects of various embodiments. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A method for forming a continuous contact plug, comprising:
   forming a first dielectric layer over a substrate;
   forming a second dielectric layer over the first dielectric layer;
   patterning the second dielectric layer to form a first recess;
   patterning the first dielectric layer by a first etchant through the first recess to form a second recess,
   wherein the first etchant has a higher etching rate with respect to the first dielectric layer than with respect to the second dielectric layer and further wherein the second recess is aligned with the first recess; and
   forming the continuous contact plug in the first recess and the second recess.

2. The method of claim 1, further comprising forming a source covered by an insulator, wherein a portion of the source is disposed in the substrate.

3. The method of claim 2, further comprising forming a gate covered by an insulator and disposed over the substrate.

4. The method of claim 3, wherein forming the first dielectric layer over the substrate further comprises: forming the first dielectric layer over the gate and the source.

5. The method of claim 3, further comprising removing a portion of the insulator to expose the gate.

6. The method of claim 5, further comprising replacing the gate formed of polysilicon with metal material.

7. The method of claim 3, further comprising etching a portion of the gate to form a third recess.

8. The method of claim 7, further comprising forming a hard mask in the third recess.

9. The method of claim 2, further comprising removing a portion of the insulator above the source.

10. The method of claim 9, further comprising removing a portion of the source to form a fourth recess.

11. The method of claim 10, further comprising forming salicide in the fourth recess.

12. The method of claim 1, further comprising forming a glue layer on a surface of the first recess and the second recess.

13. A semiconductor device, comprising:
    a first dielectric layer with a first recess;
    a second dielectric layer with a second recess, the second recess being at least partially aligned with the first recess; and
    a continuous contact plug disposed in the first recess and the second recess,
    wherein the first dielectric layer has a higher etching rate than the second dielectric layer when using a first etchant.

14. The device of claim 13, further comprising a source disposed below at least a portion of the second recess.

15. The device of claim 14, further comprising a salicide disposed at a top of the source.

16. The device of claim 15, wherein the salicide is formed of at least one of cobalt, nickel, and titanium.

17. The device of claim 13, further comprising a gate adjacent to the continuous contact plug.

18. The device of claim 17, further comprising an insulator between the gate and the continuous contact plug.

19. A method for etching a continuous recess, comprising:
forming a first dielectric layer over a substrate;
forming a second dielectric layer over the first dielectric layer;
patterning the second dielectric layer to form a first recess; and
patterning the first dielectric layer by a first etchant to form a second recess,
wherein the first etchant has a higher etching rate with respect to the first dielectric layer than with respect to the second dielectric layer and further wherein the second recess is aligned with the first recess, and the first recess and the second recess form a continuous recess.

* * * * *